United States Patent [19]
Rupich et al.

[11] Patent Number: 5,455,223
[45] Date of Patent: Oct. 3, 1995

[54] COATED PRECURSOR POWDER FOR OXIDE SUPERDONDUCTORS

[75] Inventors: Martin Rupich, Framingham; Gilbert N. Riley, Jr., Marlborough; William L. Carter, Chelmsford, all of Mass.

[73] Assignee: Amiercan Superconductor Corporation, Westborough, Mass.

[21] Appl. No.: 21,768

[22] Filed: Feb. 24, 1993

[51] Int. Cl.$^6$ .......................... H01B 12/00; H01L 39/12
[52] U.S. Cl. ................... 505/100; 505/734; 505/739; 505/785; 505/232; 505/237; 505/238; 505/470; 505/812; 428/403; 252/518; 252/521
[58] Field of Search ...................... 505/785, 734, 505/739, 100, 232, 237, 238, 470, 812; 428/403; 252/518, 521

[56] References Cited

U.S. PATENT DOCUMENTS

| | | | |
|---|---|---|---|
| 4,600,604 | 7/1986 | Siuta | 252/521 |
| 4,857,504 | 8/1989 | Hermann | 505/1 |
| 4,971,944 | 11/1990 | Charles | 505/785 |
| 5,071,826 | 12/1991 | Anderson | 505/785 |
| 5,091,362 | 2/1992 | Ferrando | 505/785 |
| 5,145,719 | 9/1992 | Towata et al. | |
| 5,200,389 | 4/1993 | Tachikawa | 505/1 |
| 5,202,306 | 4/1993 | Goretta et al. | |
| 5,217,943 | 6/1993 | Hermann | 505/740 |
| 5,260,263 | 11/1993 | Enomoto | 505/734 |

FOREIGN PATENT DOCUMENTS

| | | |
|---|---|---|
| 0387525A1 | 9/1990 | European Pat. Off. . |
| 3817319 | 12/1988 | Germany . |
| 63-230887 | 3/1987 | Japan . |
| 1-037461 | 2/1989 | Japan . |
| 4-001002 | 1/1992 | Japan . |

OTHER PUBLICATIONS

Bayya "Reducing corrosion of ceramic superconductors with solgel coatings" *Corros. Glass, Ceram. Supercond.*, 637–47 Edited: Clark et al. 1992.

Erle "Characterization of the intergrain and surface . . . " Physica C vol. 62–64 1989 pp. 1093–1094.

Jin et al., "Enhanced flux-pinning by phas decomposition in Y–Ba–Cu–O", *Appl. Phys. Lett.* 56, 1287 (1990).

Matheis et al., "The crystal structure and powder diffraction patterns of the bismuth and thallium Ruddleston–Popper copper oxide superconductors", Powder Diff. 5, 8–25 (Mar. 1990).

Zhu et al., "The effect of oxygen pressure on the formation of $(Bi,PB)_2Sr_2Ca_2Cu_3O_{10-x}$", J. Mater. Res. 7, 38–42 (Jan., 1992).

Lanagan et al., "Microstructure and electrical properties of $Pb_{0.4}Bi_{1.8}Sr_2Ca_2Cu_3O_x$/Ag composite tapes", *Material Research Society*, Abstract for Meeting, Nov. 30–Dec. 4, 1992.*

*Primary Examiner*—Christine Skane
*Assistant Examiner*—M. Kopec
*Attorney, Agent, or Firm*—Choate, Hall & Stewart

[57] ABSTRACT

In one aspect, the present invention is a precursor powder to an oxide superconductor, namely a coated particle comprising a metal oxide particle core (including a mixed metal oxide, e.g., BSCCO-2212 or YBCO-123) on which is deposited a secondary metal oxide coating (e.g., $M_nCuO_x$ or CuO). The metal oxide particle and secondary metal oxide coating together comprise metallic elements having a stoichiometry appropriate for the formation of a desired oxide superconductor. The metal oxide reacts with the secondary metal oxide under suitable conditions (e.g., heating) to form the desired oxide superconductor (e.g., BSCCO-2223 or YBCO-124). In another aspect, the invention is a method for preparing such a coated particle, comprising: preparing a precursor solution comprising a metal µ-oxo alkoxide containing metallic constituents of an oxide coating; dispersing a metal oxide powder into said precursor solution; removing excess solvent from said precursor solution, thereby depositing a precursor film comprising said metallic constituents of said oxide coating on said mixed oxide powder; and decomposing said precursor film to form said metal oxide coating. Also encompassed is a method of forming a textured oxide superconductor of desired form.

20 Claims, 4 Drawing Sheets

FIG. 1 PRIOR ART (Pb)2212 and $Ca_{0.85}CuO_{1.85}$

FIG. 2

COATED (Pb) 2212

COATED PRECURSOR POWDER FOR OXIDE SUPERDONDUCTORS

FIELD OF THE INVENTION

This invention is related to coated oxide powder precursors to oxide superconductors. The present invention further relates to oxide superconductors and superconducting articles having improved texture and enhanced rates of formation.

BACKGROUND OF THE INVENTION

Oxide superconductors are known to form by the solid state reaction of a stoichiometric mixture of metal oxides, carbonates, nitrates or oxalates and the like at temperatures above 500° C. In addition to the desired oxide superconductive phase, the reaction produces intermediate oxide phases. Consumption of the intermediate phases and complete conversion to the desired oxide superconductor requires long reaction times and multiple mixing and annealing steps. The intermediate oxide may be either non-superconductive or superconductive. For example, in the reaction to form $Bi_2Sr_2Ca_2Cu_3O_x$ (BSCCO-2223), $Bi_2Sr_2Ca_1Cu_2O_x$ (BSCCO-2212) is formed as an intermediate phase.

Alternatively, the desired oxide superconductor can also be formed from the reaction of a mechanical mixture of an intermediate oxide and secondary non-superconductive oxides. For example, the oxide superconductor $Y_1Ba_2Cu_4O_x$ (YBCO-124) can be prepared from a mixture of the oxide superconductor $Y_1Ba_2Cu_3O_x$ (YBCO-123) and copper oxide, see Jin et al., Appl. Phys. Lett. 56, p.1287 (1990). Although the use of an intermediate superconductive oxide provides a better mixing of some components of the system before reaction, the equi-axed granular structure of the secondary non-superconductive oxides still causes a significant degree of non-homogeneity. As well, long reaction times and multiple mixing and annealing steps are still required.

Figure 1:
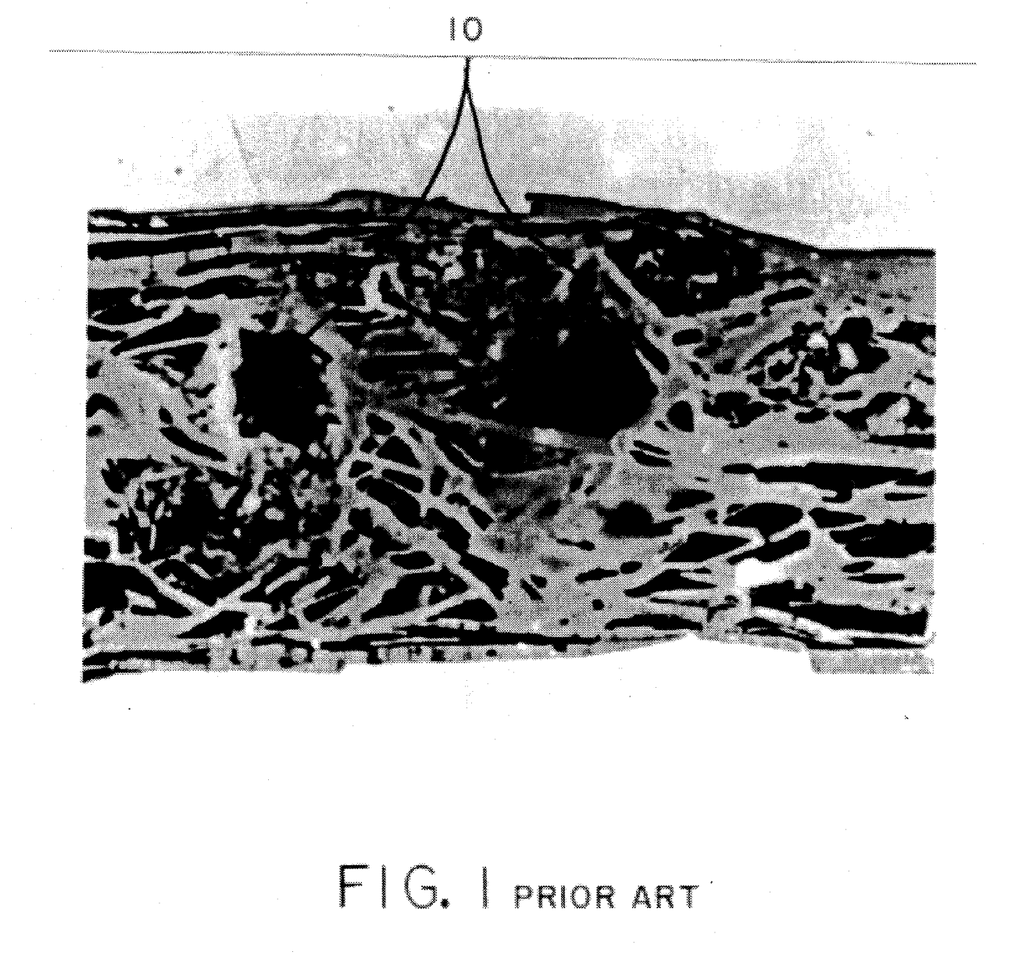
FIG. 1 is an optical photomicrograph of the texture of typical, plate-like oxide superconductor grains, with grains of secondary non-superconsutive oxide disrupting its planar alignment.

Performance of the oxide superconductor, and of articles formed from such oxide superconductors, is related to the degree of orientation or "texture" of the superconductive oxide grains. Texture is induced by the preferential growth of the grains in the ab plane within a constrained volume during thermal heat treatment, and by deformation processes which align anisotropic (e.g., plate-like) oxide superconductor grains in the plane of minimum compressive stress. The equi-axed or granular structure of the secondary non-superconductive oxides disrupts the planar alignment of the plate-like oxide superconductor grains in two ways. The non-superconductive oxides prevent efficient deformation-induced texture by impeding the alignment of the oxide superconductor grains and by preventing full densification of the material. For instance, note the equi-axed or granular secondary non-superconductive oxides 10 in FIG. 1. The equi-axed grains 10 also interrupt the preferential grain growth of thermally induced texturing. The relatively low surface area of the oxide grains necessitates a long reaction time to "react away" the disruptive secondary non-superconductive oxide particles.

Therefore, it is highly desired to eliminate large, equi-axed secondary metal salts, including non-superconductive oxides, in the formation and texturing of an oxide superconductor. Use of finer particle-size metal salts may somewhat improve the rate of formation of the oxide superconductor. However, such use cannot prevent the spatially non-uniform dispersion of metal salt particles, which will adversely affect both texture and formation rates.

It is therefore an object of the present invention to overcome the above limitations of the prior art and to provide an oxide precursor powder which can rapidly and efficiently form the desired oxide superconductor.

It is yet another object of the present invention to provide an oxide precursor powder that is readily deformable, so that grains of the oxide superconductor can be aligned.

It is yet another object of the present invention to provide a method for producing the above oxide precursor powder.

SUMMARY OF THE INVENTION

The limitations of the prior art can be overcome by use of an oxide-coated particle as a precursor in the preparation of a desired oxide superconductor and formation of desired articles from such oxide superconductors. The particle core is a "metal oxide", used herein to mean a complex oxide containing more than one metal, which is an intermediate to the desired oxide superconductor phase. The metal oxide particle core may be, for example, a mixed metal oxide. "Coating", as that term is used herein, refers to a material that surrounds and is adhered to the particle core. The coating may be continuous or discontinuous. The metal oxide particle may or may not be itself an oxide superconductor. The oxide coating includes a secondary metal oxide. Together the metal oxide particle and the metal oxide coating have metallic elements in a stoichiometry appropriate for the formation of the desired oxide superconductor. The metal oxide particle core and the secondary metal oxide coating are reacted together to form the desired oxide superconductor, for example, by heat or microwave treatment.

The secondary metal oxide may be a simple metal oxide, such as copper oxide, or it may be a complex metal oxide composition having the nominally general composition $M_nCuO_x$, where M is selected from the group consisting of lithium, antimony, alkaline earths, lanthanides, heavy metals and combinations thereof, where n ranges from zero to two and where x ranges from 1 to 6. In particular, the complex metal oxide composition may be $M_nCuO_x$, where M is selected from the group consisting of Bi, Sr, Ca, Pb and combinations thereof, where n ranges from zero to two and where x ranges from 1 to 4. Lithium and antimony have been reported to enhance the critical or transition temperature of the oxide superconductor.

The metal oxide particle may be any complex oxide capable of reacting to form the desired oxide superconductive phase. Although it is not required in order to practise the present invention, in many instances, the metal oxide particle core is itself a superconductive oxide. For example, BSCCO-2212 and YBCO-123 are suitable mixed metal oxides serving as an intermediate for the formation of BSCCO-2223 and YBCO-124, respectively. Suitable metal oxides include members of the bismuth-strontium-calcium-copper oxide-based family of compounds—in particular, layered bismuth-based oxide superconductors such as $Bi_2Sr_2Ca_{n-1}Cu_nO_x$, where $x=2n+4+\delta$, or $BiSr_2Ca_{n-1}Cu_nO_{x-1.5}$, with $0 \leq n \leq \infty$ in both species. Also suitable for use are the layered thallium phase superconductor series, $TlBa_2Ca_{n-1}Cu_nO_x$ or $Tl_2Ba_2Ca_{n-1}Cu_nO_x$, where $0 \leq n \leq \infty$.

To capitalize on the improved texture aspect of the invention in an article comprising the present superconductive oxide system, it is further required that the metal oxide particle be deformable. The term "deformable" is used herein to mean that the material is capable of orientation under an applied stress, by virtue of the metal oxide particle grains having an aspected structure or anisotropic properties, or both.

Another aspect of the invention is a method for preparing an oxide-coated metal oxide powder. A metal μ-oxo alkoxide precursor solution containing metallic constituents of an oxide coating is prepared, followed by dispersion of a metal oxide powder into the precursor solution. Excess solvent is then removed from the precursor solution, thereby depositing a precursor film comprising the metallic constituents of the oxide coating on the mixed oxide powder. Lastly, the precursor film is decomposed to form the metal oxide coating.

In preferred embodiments, the precursor solution comprises a soluble metal μ-oxo alkoxide. The metal μ-oxo alkoxide may have the formula $O(OR)_zM_nCu$, where: M is selected from the group consisting of alkaline earths, lanthanides, heavy metals, lithium, antimony and combinations thereof; R is an alkyl group; z ranges from zero to six; and n ranges from zero to two. In particular, the metal μ-oxo alkoxide has the formula $O(OR)_zM_nCu$, where: M is selected from the group consisting of Bi, Ca, Pb, Sr and combinations thereof; R is an alkyl group; z ranges from zero to six; and n ranges from zero to two.

The homogeneity and large surface area contact in the oxide-coated precursor powder of the present invention permit enhanced reaction kinetics in the formation of the desired oxide superconductor. In addition, the absence of equi-axed co-powders prevents the disruption of deformation-induced texture in deformable metal oxide powders.

DESCRIPTION OF THE PREFERRED EMBODIMENT

Figure 2:
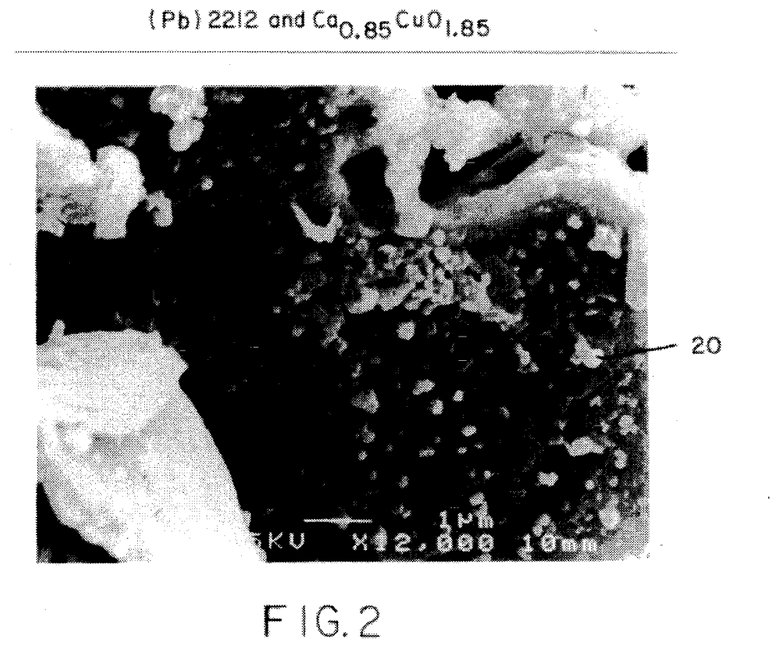
FIG. 2 is an optical photomicrograph of a coated particle of the present invention, namely a "$Ca_{0.85}CuO_{1.85}$"-coated (Pb)2212.

A coated oxide powder of the present invention, shown in the optical micrograph of FIG. 2, has several advantages over the prior art powders for the processing of oxide superconductors.

First, the secondary metal oxide coating covers the metal oxide particle core in a homogeneous, uniform layer. Surface contact between the two phases is maximized, so that superconductor formation is significantly enhanced.

Second, the secondary metal oxide coating conforms to the surface of the metal oxide particle core. Hence, there are no equi-axed or granular secondary phases to disrupt the alignment of either the intermediate metal oxide or the desired oxide superconductor. Additionally, the coating conforms with any texturing that is carried out on the intermediate metal oxide by deformation or other process. When the oxide-coated precursor powder is then converted to the desired oxide superconductor, the induced texture is transferred with essentially no loss.

The composition of the secondary metal oxide coating which coats the metal oxide particle, is characterized nominally as "$M_nCuO_x$". M can be one or more metals, while n can be varied to give any ratio of metals. The ratio of metals is determined by the starting composition of materials used to prepare the oxide coating, as discussed previously. "$M_nCuO_x$" may not exist as a discreet compound. In fact, at least two phases typically exist, CuO and a metal oxide, which together give the overall oxide composition. In particular, a preferred secondary oxide coating, "$CaCuO_2$", exists ultimately as an evenly dispersed mixture of CuO and $Ca_2CuO_3$. The 2212 phase is considered to be a particularly desirable metal oxide because it can be readily prepared as a phase-pure powder by standard techniques (e.g., freeze-drying, spray pyrolysis, solid state annealing). It is also readily deformable.

One method of making the metal oxide coating is thermal decomposition of a metal-containing precursor that can first be deposited upon the core metal oxide particle directly from solution or by vapor phase deposition. The metal-containing precursor must be of a form that can be converted into a homogeneously dispersed metal oxide.

Members of the bismuth-strontium-calcium-copper-oxide family of compounds, as defined by $Bi_nSr_2Ca_nCu_{n+1}O_{2n+6+\delta}$, where $0 \geq n \geq \infty$ and $-1 \geq \delta \geq 1$, are suitable metal oxide precursors-in particular, layered bismuth-based oxide superconductors such as the double-layer bismuth phase. One particular metal oxide is preferably $Bi_2Sr_2Ca_1Cu_2O_x$, where $7<x<9$. It should be understood that all chemical equations cited herein merely include nominal stoichiometry, it being recognized that nonstoichiometry can often occur and that dopants may be added. For example, it is often desirable to add lead dopant to BSCCO to help stabilize the 2223 phase. Precursor coated particles may also be formed, by way of this invention, from the single- or double-layered thallium-based oxide superconductor superconductor series, $TlBa_2Ca_{n-1}Cu_nO_x$ or $Tl_2Ba_2Ca_{n-1}Cu_nO_x$. For further examples of bismuth and thallium superconductors, the reader is directed to Matheis et al., "The Crystal Structures and Powder Diffraction Patterns of the Bismuth and Thallium Ruddleston-Popper Copper Oxide Superconductors", POWDER DIFFRACTION 5, pp. 8–25 (March 1990).

A precursor solution is made such that the stoichiometry of the solution plus the starting metal oxide particle or powder, i.e., 2212 powder, gives the overall stoichiometry for the desired oxide superconductor. Therefore, in the case of forming 2223, a solution containing 1:1 Ca:Cu is made for use with 2212 powder. Possible metal salts for the preparation of the precursor solution include nitrates, acetates and other organic and inorganic acid salts, and metal organic compounds such as metal alkoxides. It is important that the metals-in particular, copper--have high solubility in the precursor solution so that the metals do not precipitate from solution prior to coating the 2212 powder. By way of example, copper may be solvated as an oxide in pyridine. Metal μ-oxo alkoxide compounds, such as $(\mu_x-O_3)(\mu_x-Or)_7Cu_3Ba_2Y$ precursors useful in forming the $YBa_2Cu_3O_{7-x}$ superconductor phase, have also been observed to form solutions. Upon concentration, they form highly homogeneous solids, with no segregation or preferential precipitation of metal complexes.

Some care should be taken in the selection of the solvent. While aqueous and slightly acidic solutions are useable, they may react with some metal oxide powders. Non-aqueous solvents, such as alcohols, pyridine and organohalides, are particularly preferred because of their inertness to the oxide powders. The solvent should have a reasonably high vapor pressure to permit efficient removal at low temperatures.

The 2212 powder is added to the solution and the solvent is then driven off slowly such that a gel coating forms on the 2212 powder. The precursor-coated powder is then to decomposed by, for example, heating the gel coating, thereby forming the metal oxide coating. The decomposition temperature will vary depending upon the composition of the gel coating.

It has been determined that a particularly preferred precursor solution contains soluble metal μ-oxo alkoxides, such as μ-O(OR)$_2$CaCu. By way of example, metal μ-oxo copper alkoxides were prepared from the reaction of a soluble polymeric copper oxide compound with an appropriate calcium alkoxide, according to eq (1), $$a\ (py_mCuO)_n + bn\ Ca(OR)_2 \rightarrow n\ \mu\text{-}O_a(OR)_{2b}Ca_bCU_a + (a\ m\ n)\ py, \quad (1)$$

where py is an amine such as pyridine, and R is an alkyl group forming part of an alkoxide, such as methoxyethoxide (OC$_2$H$_4$OCH$_3$). The soluble μ-oxo copper(II) polymer—(py$_m$CuO)$_n$—was prepared by oxidation of copper(I) chloride in pyridine by molecular oxygen according to eq (2), $$4n\ CuCl + n\ O_2 \rightarrow (CuO)_{2n} + 2n\ CuCl_2. \quad (2)$$

Figure 3:
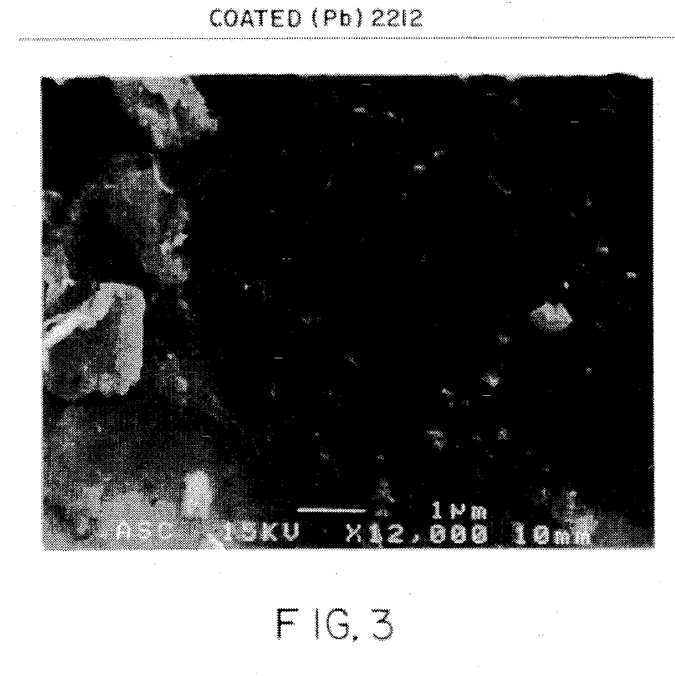
FIG. 3 is an optical photomicrograph of coated (Pb)2212 before decomposition of the precursor coating.

The μ-oxo alkoxides are highly soluble in non-aqueous solvents, particularly in mixtures containing alcohol, pyridine, or an organohalide such as methylene chloride. The μ-oxo alkoxides can be readily isolated as discrete solids by solvent evaporation. Thus, they are easily deposited on the 2212 powder. FIG. 3 is an optical photomicrograph of a μ-oxo alkoxide-coated 2212 powder prior to decomposition of the precursor coating. The precursor coating is homogeneous and continuous over the entire surface of the 2212 platelets so that the latter are no longer distinct. Conversion of the precursor coating into the coated particle's metal oxide coating occurs at high efficiency.

The thermal decomposition of metal alkoxide precursors may occur in an inert atmosphere. For instance, decomposition of μO$_a$(OR)$_{2b}$Ca$_b$Cu$_a$ in an inert atmosphere occurs according to eq (3),

$$\mu\text{-}O_2(OR)_{2b}Ca_bCu_a \rightarrow Ca_bCu_aO_{b+a} + b\ ROR. \quad (3)$$

The decomposition temperature is in the range of 400° to 800° C. The exact temperature of decomposition varies with the nature of the alkoxide.

When the thermal decomposition was carried out with a μ-O(OR)$_2$CaCu coating on 2212 powder, the resulting product was a 2212/CaCuO$_2$ powder, wherein each individual 2212 grain was coated with a uniform, homogeneous CaCuO$_2$ layer. This layer is shown in FIG. 2. The CaCuO$_2$-coated 2212 powder was then converted to the 2223 phase under the reaction conditions set out as follows.

The precursor coated particles of the invention improve superconductor performance by way of depositing a homogeneous CaCuO$_2$-coating on the surface of a BSCCO-2212 powder. The particles within the CaCuO$_2$ coating are spatially uniform, so it does not disrupt the layering and alignment of the 2212 grains. Furthermore, the coating adheres to the 2212 powder, so that it moves with the 2212 powder during any alignment step. The resulting orientation in an article comprising the coated 2212 powder, remains stable during the conversion process of the aligned coated 2212 to a 2223 product.

One example of a method for converting the coated powder to a desired oxide superconductor is heat treatment of the coated particle, e.g., coated Pb-2212 phase, at 825° C. for about 50 hours in 0.075 atm O$_2$. The finely dispersed, spatially homogeneous CaCuO$_2$ coating reacts with the 2212 phase to form the 2223 phase according to eq (4),

$$Bi_2Sr_2Ca_1Cu_2O_x + CaCuO_2 \rightarrow Bi_2Sr_2Ca_2Cu_3O_x, \quad (4)$$

where x ranges from 7 to 9. Optimally, this reaction occurs through an intercalation mechanism resulting in the direct formation of the 2223 phase without the intermediate formation of any secondary phases. This optimal mechanism contrasts with a heterogeneous nucleation-and-growth mechanism, in which 2223 nuclei form in an undesirable, more random orientation, i.e., texture is lost during the conversion process. The 2223 phase is expected to form with the same morphology and orientation present in the precursor 2212 phase, thereby enabling textured articles formed of the desired oxide superconductor. In order for the reaction of eq (4) to proceed as rapidly as possible, it is desirable that the CuCaO$_2$ coating is homogeneous and uniformly dispersed upon the 2212 phase, ideally in an amorphous state.

FIG. 2 is an optical photomicrograph of platelets of Bi$_{2-x}$Pb$_x$Sr$_2$CaCu$_2$O$_y$ ("Pb-2212"), coated with fine particles 20 of Ca$_{0.85}$CuO$_{1.85}$. In this instance, x is 0.32 and y ranged from 7.5 to 8.5. The well-defined platelets of the Pb-2212 phase are clearly visible. The oxide particles 20 are homogeneous from particle to particle, and are evenly dispersed and securely adhered over the surface of the 2212 platelets.

Figure 4:
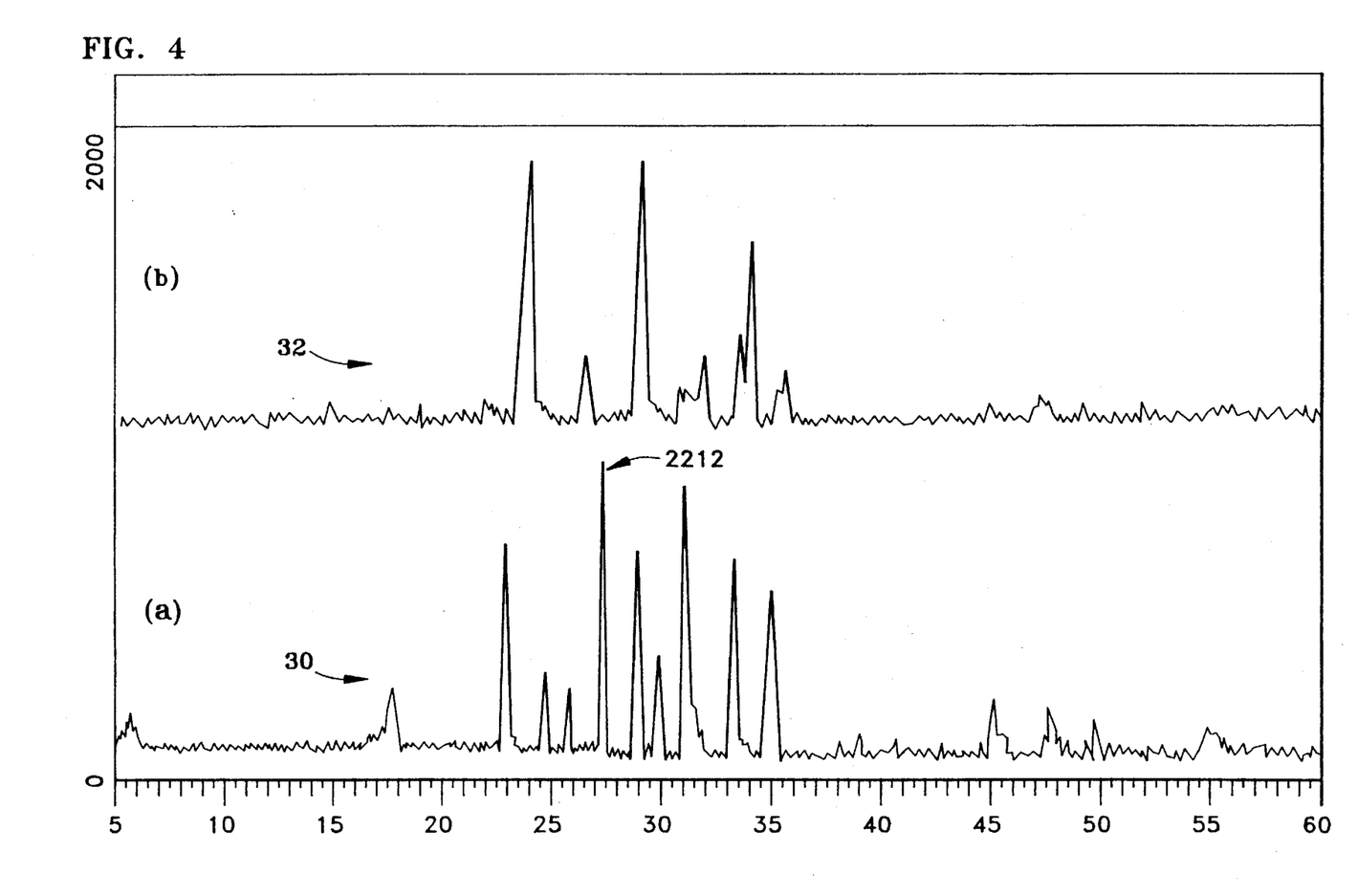
FIG. 4 represents superimposed X-ray diffraction patterns for (a) "$Ca_{0.85}CuO_{1.85}$"-coated (Pb)2212 and (b) the (Pb)2223 product.

To demonstrate the advantages of the present invention, oxide superconductor formation from the coated Pb-2212 phase was compared to oxide superconductor formation with prior art materials, as shown in FIG. 4. A coated Pb-2212 phase (such as the one shown in FIG. 2) was heated at 825° C. for about 50 hours in 0.075 atm O$_2$. Under these conditions, the coated 2212 was substantially converted to 2223 phase without an intermediate grinding step, i.e., reaction was almost 100% efficient. In contrast, with prior art mechanical mixtures of 2212 and secondary nonsuperconductive oxides, an intermediate grinding step is essential for conversion of uncoated 2212 to the 2223 to occur at temperatures below 840° C. Zhu et al., "The effect of oxygen partial pressure on the formation of (Bi,Pb)$_2$Sr$_2$Ca$_2$Cu$_3$O$_{10-x}$", J. Mat. Res. 10, pp. 38–42 (January 1992) (see, e.g., p.39, col. 2, lines 16–18, and p.40, Zhu's FIG. 2(c)). As well, lower-temperature conversion of 2212 to 2223 by prior art precursors and methods, occurs much less efficiently than by way of the present invention. The extent of the conversion reaction is demonstrated in FIG. 4, in which the X-ray diffraction pattern of the starting CaCuO$_2$-coated 2212 is denoted by trace 30 in FIG. 3(a), while the X-ray diffraction pattern of the 2223 product is denoted by trace 32 in FIG. 3(b). These traces indicate that no 2212 remains in the 2223 product made by way of the present invention, within the detection limits of the X-ray diffractometer.

Figure 5:
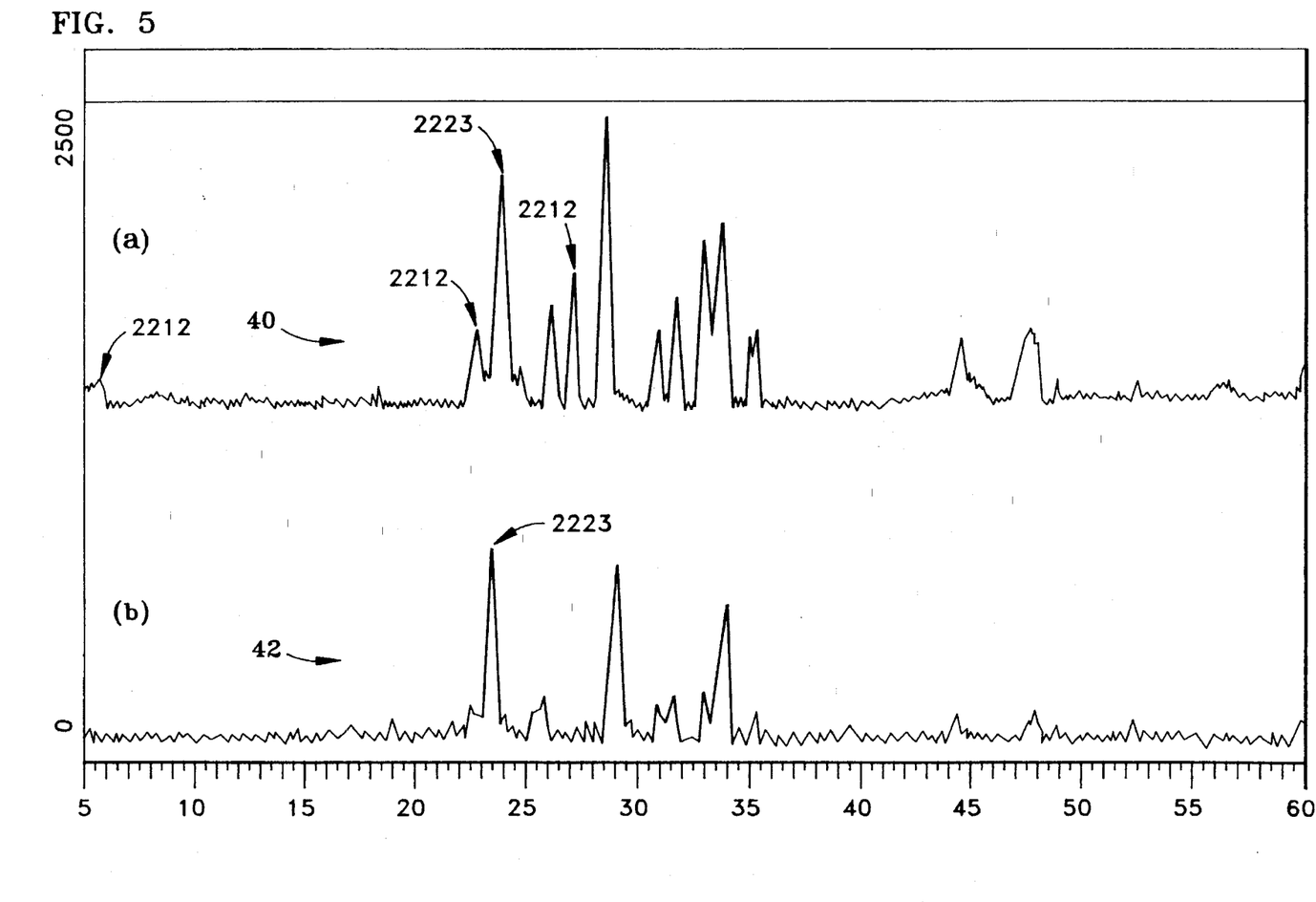
FIG. 5 represents X-ray diffraction patterns of a Pb-2223 product derived from: (a) the "$Ca_{0.85}CuO_{1.85}$"-coated Pb-2212 of the present invention; and (b) a mechanical mixture of Pb-2212 and co-precipitated $CaCuO_2$.

In a second comparison represented by FIG. 5, the oxide-coated precursor powder of the present invention (Pb-2212/CaCuO$_2$) was also compared to mixtures of 2212 powder and calcium copper oxide powder formed by known co-precipitation methods from the calcium and copper oxalates. The two powders were subjected to the identical heat treatment of 825° C. for 50 hr in 0.075 atm O$_2$. The X-ray diffraction patterns for the resultant product powders, including a characteristic peak for 2223 at 24° (labeled 2223), are shown in FIG. 4. Trace 42 in FIG. 4(b) represents the X-ray diffraction pattern for the 2223 powder of the present invention, in which the characteristic peaks for 2212 are almost entirely absent. The most distinctive 2212 peak occurs at 2 θ or 27.5°; other distinguishable 2212 peaks may be observed at 6° and 23° (labeled 2212). In contrast, trace 40 in FIG. 4(a) represents the product of reacting 2212 powder with the co-precipitated calcium copper oxide, wherein 2212 remains a principal component of the product powder, as evidenced by the presence of the characteristic 2212 peaks. Hence, while the coated particles of the present invention give nearly 100% efficiency of 2212-to-2223 conversion, prior art methods and materials gives much less efficiency, 70–80%, of conversion.

In a further aspect of the present invention, the coated powder may be used to make any form or article of oxide superconductor desired. For instance, the coated powder of this invention may be textured by deformation within a metallic sheath. A coated powder is introduced-by tamping, pouring, isostatic pressing, vibrocompaction, or other method-and optionally sealed into a metallic sheath or billet, preferably of silver. The actual process used to deform the powder-in-billet will vary according to the form desired. Axisymmetric forms may be obtained by extrusion, drawing, swaging, calibrated rolling, and the like. Non-axisymmetric forms are obtained by such processes as rolling, pressing, or hammer-forging. Furthermore, the processed billet may be grouped or bundled with other, similarly processed billets to produce multifilamentary composites. For the case of coated, aspected grains, texture is developed in the direction of minimum compressive stress. For axisymmetric (e.g., cylindrical) reductions, the particles or plates will align tangentially. For non-axisymetric reductions, the plates will align in the plane of spreading (i.e., extension). Rolling is a convenient process for producing a non-axisymmetric form, by inducing platey particles to align in one cartesian plane, which is useful for certain applications. The texture may further develop upon heat treatment, through volume-constrained anisotropic grain growth. This texture will be preserved upon conversion of the coated precursor 2212 particle to a desired 2223 superconductor phase, through intercalative phase transformations.

Merely by way of an example, the coated particles may be packed and sealed into a billet of silver or any Ag-bearing alloy with an 0.625" OD and an 0.325" ID. The powder-packed billet is then extruded to 0.250"OD; wire-drawn to 0.070"OD; and finally rolled into a tape 0.006" thick and 0.10" wide for thorough texture evolution. To enhance texturing even further, this tape may be heat-treated at 815° C. and 0.075 atm $O_2$ for about 50 hours; rolled again, to a thickness of about 0.004"; and heat-treated yet again.

Other embodiments of the invention will be apparent to those skilled in the art from consideration of the specification or practice of the invention disclosed herein. It is intended that the specification and examples be considered as merely exemplary, the true scope and spirit of the invention being indicated by the following claims.

A major feature of the present invention is the formation of a homogeneous, uniform metal oxide coating on a metal oxide powder. In particular, the properties of the metal μ-oxo alkoxide complex allows the precise control of the metal composition and insures the formation of a metal oxide with high particle-to-particle homogeneity. The formation of a uniform, homogeneous metal oxide film on the 2212 powder results in the efficient formation of 2223 without the formation of unwanted secondary phases.

What is claimed is:

1. A coated particle, comprising:

a powdered complex metal oxide particle which comprises at least two different metals and a secondary metal oxide coating deposited on said powdered metal oxide particle, wherein said secondary metal oxide has a composition $M_nCuO_x$, where M is selected from the group consisting of Li, Sb, Y, alkaline earths, lanthanides, heavy metals and combinations thereof; n ranges from zero to two, and x ranges from 1 to 6; and wherein said powdered metal oxide particle and said secondary metal oxide coating together comprise metallic elements having a stoichiometry appropriate for the formation of a desired oxide superconductor.

2. A coated particle, comprising:

a powdered complex metal oxide particle which comprises at least two different metals and a secondary metal oxide coating deposited on said powdered metal oxide particle;

wherein said secondary metal oxide has a composition $M_nCuO_x$, where: M is selected from the group consisting of Li, Sb, Y, alkaline earths, lanthanides, heavy metals and combinations thereof; n ranges from zero to two; and x ranges from 1 to 6, and wherein said powdered metal oxide particle has an aspected grain structure, anisotropic properties, or both, and is deformable; and wherein said powdered metal oxide particle and said secondary metal oxide coating together comprise metallic elements having a stoichiometry appropriate for the formation of a desired oxide superconductor.

3. A coated particle, comprising:

a powdered metal oxide particle which comprises at least two different metals having a copper μ-oxo alkoxide coating deposited thereon, wherein said metal oxide particle and said copper μ-oxo alkoxide coating together comprise metallic elements having a stoichiometry appropriate for the formation of a desired oxide superconductor.

4. A composite, comprising:

a plurality of aspected coated particles, the coated particles further comprising:

a powdered complex metal oxide particle which comprises at least two different metals and a secondary metal oxide coating deposited on said powdered metal oxide particle, wherein said secondary metal oxide has a composition $M_nCuO_x$, where M is selected from the group consisting of Li, Sb, Y, alkaline earths, lanthanides, heavy metals and combinations thereof; n ranges from zero to two, and x ranges from 1 to 6; and wherein said powdered metal oxide particle and said secondary metal oxide coating together comprise metallic elements having a stoichiometry appropriate for the formation of a desired oxide superconductor, wherein the aspected particles are aligned in a direction of minimum compressive stress.

5. The coated particle of claim 1 or 2, wherein said powdered metal oxide particle is substantially completely covered by said secondary metal oxide coating.

6. The coated particle of claim 3, wherein said powdered metal oxide particle is substantially completely covered by said metal μ-oxo alkoxide coating.

7. The coated particle of claim 1 or 2, wherein said powdered metal oxide particle is discontinuously covered by said secondary metal oxide coating.

8. The coated particle of claim 3, wherein said powdered metal oxide particle is discontinuously covered by said metal μ-oxo alkoxide coating.

9. The coated particle of claim 1 or 2, wherein said secondary metal oxide coating is of a substantially uniform thickness.

10. The coated particle of claim 3, wherein said metal μ-oxo alkoxide coating is of a substantially uniform thickness.

11. The coated particle of claim 1, 2, or 3, wherein said coating is homogeneous from particle to particle.

12. The coated particle of claim 1, 2 or 3, wherein said powdered metal oxide is a member of the bismuth-strontium-calcium-copper-oxide superconductor family, as defined by $Bi_nSr_2Ca_nCu_{n+1}O_{2n+6+\delta}$, where $0 \leq n \leq \infty$ and $-1 \leq \delta \leq 1$.

13. The coated particle of claim 1, 2 or 3, wherein said powdered metal oxide comprises a layered bismuth-based oxide superconductor.

14. The coated particle of claim 1, 2 or 3, wherein said powdered metal oxide comprises a two-layer bismuth-based superconductor $Bi_2Sr_2Ca_1Cu_2O_{7-9}$.

15. The coated particle of claim 1, 2 or 3, wherein said powdered metal oxide comprises a layered thallium-based oxide superconductor.

16. The coated particle of claim 1, 2 or 3, wherein said powdered metal oxide comprises a layered yttrium- or lanthanide-based superconductor.

17. The coated particle of claim 1 or 2, wherein said secondary metal oxide has a formula $M_nCuO_x$, where M is selected from the group consisting of Bi, Sr, Ca, Pb and combinations thereof, and where n ranges from zero to two and x ranges from 1 to 4.

18. The coated particle of claim 17, where M is Ca.

19. The coated particle of claim 17, where n equals or is close to 0.85.

20. The coated particle of claim 1, wherein the metal oxide particle, upon heating, reacts with the secondary metal oxide to form the desired oxide superconductor.

\* \* \* \* \*

UNITED STATES PATENT AND TRADEMARK OFFICE
CERTIFICATE OF CORRECTION

PATENT NO. : 5,455,223
DATED : October 3, 1995
INVENTOR(S) : Martin Rupich et al It is certified that error appears in the above-indentified patent and that said Letters Patent is hereby corrected as shown below:

On the title page: Item [73] Assignee, please change the name of the Assignee from "American Superconductor Corporation" and insert therefor -- American Superconductor Corporation--;

Column 5, line 10, after "then" please delete "to"; and

Column 8, line 23, after "6" please delete "and"

Signed and Sealed this

Thirtieth Day of April, 1996

Attest:

BRUCE LEHMAN

Attesting Officer     Commissioner of Patents and Trademarks